United States Patent
Bonora et al.

(10) Patent No.: US 6,533,101 B2
(45) Date of Patent: Mar. 18, 2003

(54) INTEGRATED TRANSPORT CARRIER AND CONVEYOR SYSTEM

(75) Inventors: Anthony C. Bonora, Menlo Park, CA (US); Richard H. Gould, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 10/123,850

(22) Filed: Apr. 16, 2002

(65) Prior Publication Data

US 2002/0108842 A1 Aug. 15, 2002

Related U.S. Application Data

(63) Continuation of application No. 09/466,989, filed on Dec. 10, 1999, which is a continuation-in-part of application No. 09/103,479, filed on Jun. 24, 1998, now Pat. No. 6,223,886.

(51) Int. Cl.⁷ .............................................. B65G 37/00
(52) U.S. Cl. ................................ 198/465.1; 414/940
(58) Field of Search .......................... 198/465.1, 465.2, 198/867.01, 867.13; 414/940

(56) References Cited

U.S. PATENT DOCUMENTS

| | | | |
|---|---|---|---|
| 3,746,148 A | 7/1973 | Hilger et al. | 198/219 |
| 3,840,110 A | 10/1974 | Molt et al. | 198/127 R |
| 3,927,620 A | 12/1975 | Clapham | 104/148 LM |
| 3,976,330 A | 8/1976 | Babinski et al. | 302/2 R |
| 4,014,428 A | 3/1977 | Ossbahr | 198/345 |
| 4,093,084 A | 6/1978 | Ringer | 214/11 R |
| 4,305,335 A | 12/1981 | Plugge | 104/172 B |
| 4,311,427 A | 1/1982 | Coad et al. | 414/217 |
| 4,453,627 A | 6/1984 | Wilkins | 198/781 |
| 4,461,382 A | 7/1984 | Hoover et al. | 198/781 |
| 4,513,854 A | 4/1985 | Prodel et al. | 198/472 |
| 4,515,264 A | 5/1985 | Sticht | 198/344 |
| 4,530,287 A | 7/1985 | Sticht | 104/168 |
| 4,534,462 A | 8/1985 | Hoover et al. | 198/781 |
| 4,572,358 A | 2/1986 | Swain | 198/781 |
| 4,619,205 A | 10/1986 | Sticht | 104/168 |
| 4,682,927 A | 7/1987 | Southworth et al. | 414/217 |
| 4,744,712 A | 5/1988 | Mitchell | 414/217 |
| 4,793,262 A | 12/1988 | Horn | 104/168 |

(List continued on next page.)

FOREIGN PATENT DOCUMENTS

EP        0 674 069 A1      3/1994

Primary Examiner—Khoi H. Tran
(74) Attorney, Agent, or Firm—O'Melveny & Myers LLP

(57) ABSTRACT

A system for transporting articles. The transport system includes a conveyor system which includes a transport carrier for carrying one or more articles between workstations and a drive rail and a support rail for supporting the transport carrier. The drive rail includes a drive system for propelling the transport carrier between workstations. At least one shoe carried by the transport carrier rides on the support rail for movably supporting the transport carrier on the support rail. The transport system may also includes a protective container including a housing having an interior compartment for supporting one or more articles. The bottom surface of the housing is configured to engage the drive system such that actuation of the drive system propels the housing along the drive and support rails. At least one shoe carried by the housing is configured to ride on the support rail of the conveyor system to movably support the housing on the support rail. The transport system also includes the method of transporting articles including the steps of providing a transport carrier for holding at least one article and having at least one shoe, positioning the transport carrier with the base of the carrier supported on a drive rail and the shoe supported on a support rail, and actuating a drive system carried by the drive rail to propel the transport carrier along the drive rail and support rail.

9 Claims, 13 Drawing Sheets

U.S. PATENT DOCUMENTS

| | | | |
|---|---|---|---|
| 4,805,759 A | 2/1989 | Rochet et al. | 198/346.1 |
| 4,826,360 A | 5/1989 | Iwasawa et al. | 406/51 |
| 4,926,753 A | 5/1990 | Weiss | 104/88 |
| 4,940,000 A | 7/1990 | Horvath et al. | 104/295 |
| 4,974,519 A | 12/1990 | Miletto | 104/165 |
| 5,086,910 A | 2/1992 | Terpstra | 198/572 |
| 5,129,507 A | 7/1992 | Maeda et al. | 198/781 |
| 5,213,201 A | 5/1993 | Huber et al. | 198/781 |
| 5,285,887 A | 2/1994 | Hall | 198/460 |
| 5,318,167 A | 6/1994 | Bronson et al. | 198/577 |
| 5,452,801 A | 9/1995 | Horn | 206/454 |
| 5,521,563 A | 5/1996 | Mazzochette | 333/116 |
| 5,533,844 A | 7/1996 | Ekleberry | 409/159 |
| 5,673,804 A | 10/1997 | Weiss et al. | 212/274 |
| 5,906,262 A | 5/1999 | Miki | 198/341.02 |
| 5,927,464 A | 7/1999 | Clark et al. | 198/349 |
| 6,033,175 A | 3/2000 | Pflueger et al. | 414/401 |
| 6,050,768 A | 4/2000 | Iwasaki et al. | 414/222.01 |
| 6,053,694 A | 4/2000 | Dill | 414/778 |
| 6,112,886 A | 9/2000 | Horn | 198/867.11 |
| 6,223,886 B1 | 5/2001 | Bonora et al. | 198/465.2 |
| 6,308,818 B1 * | 10/2001 | Bonora et al. | 198/465.1 |
| 6,435,330 B1 * | 8/2002 | Bonora et al. | 198/346.3 |

* cited by examiner

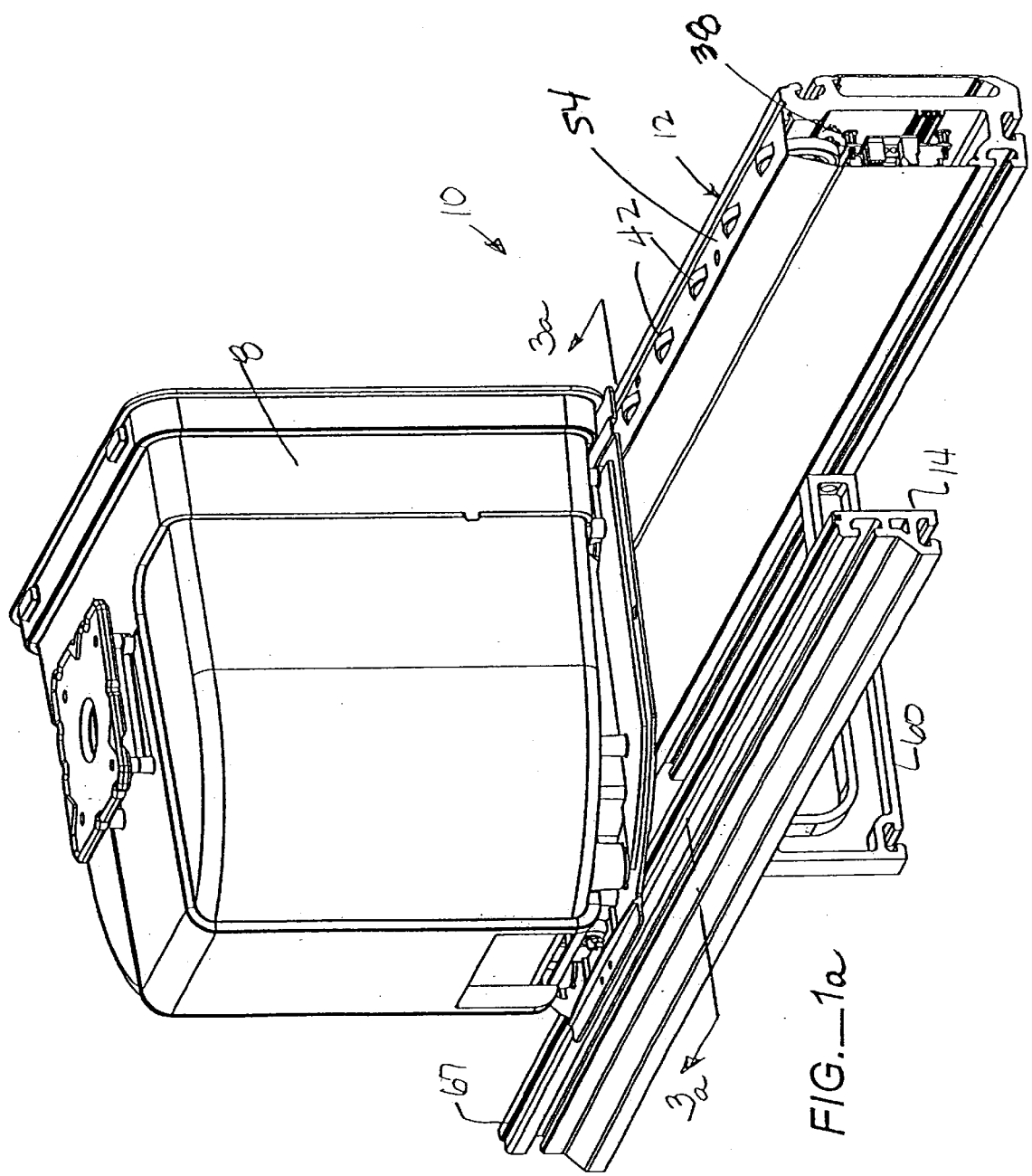

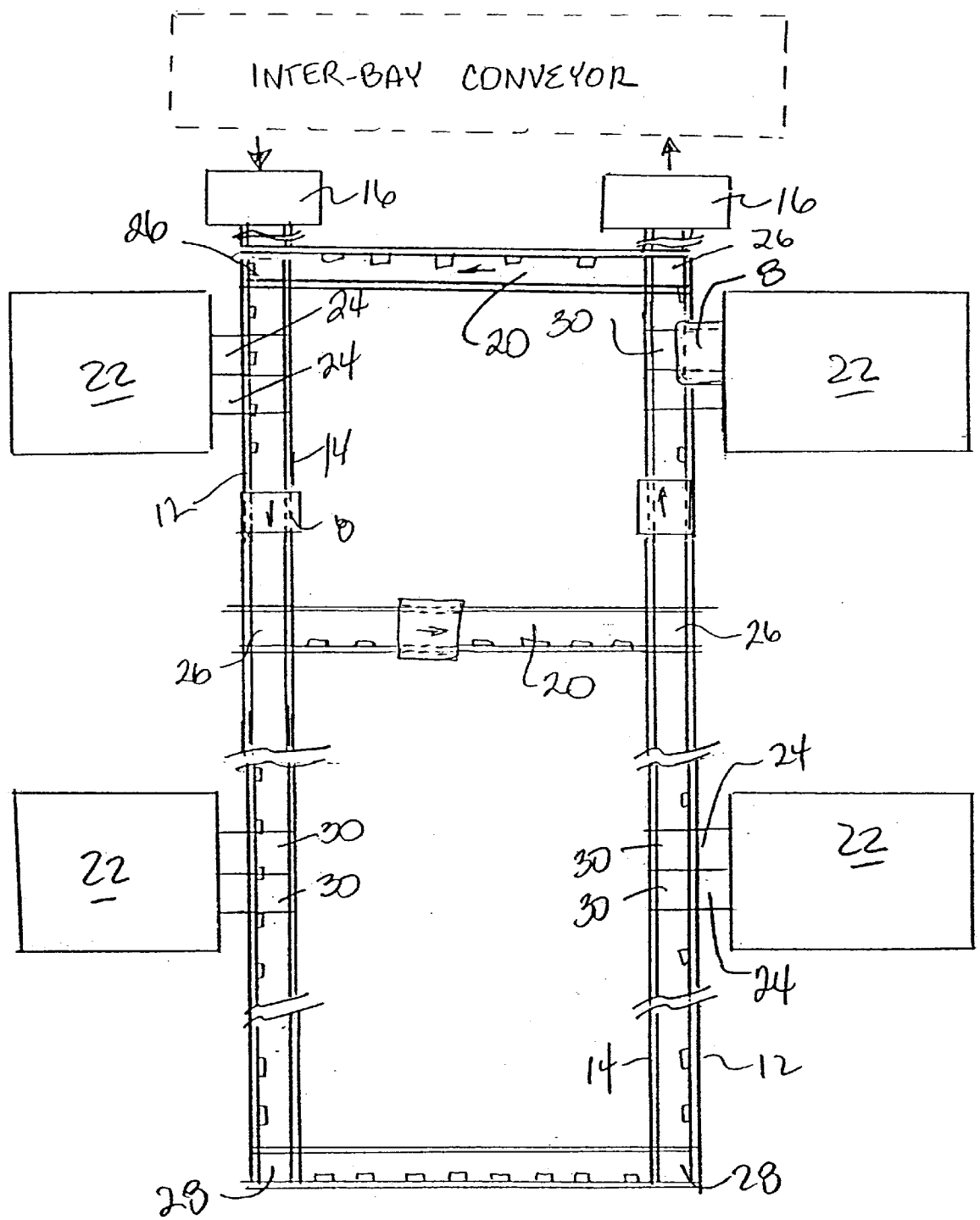
FIG._2

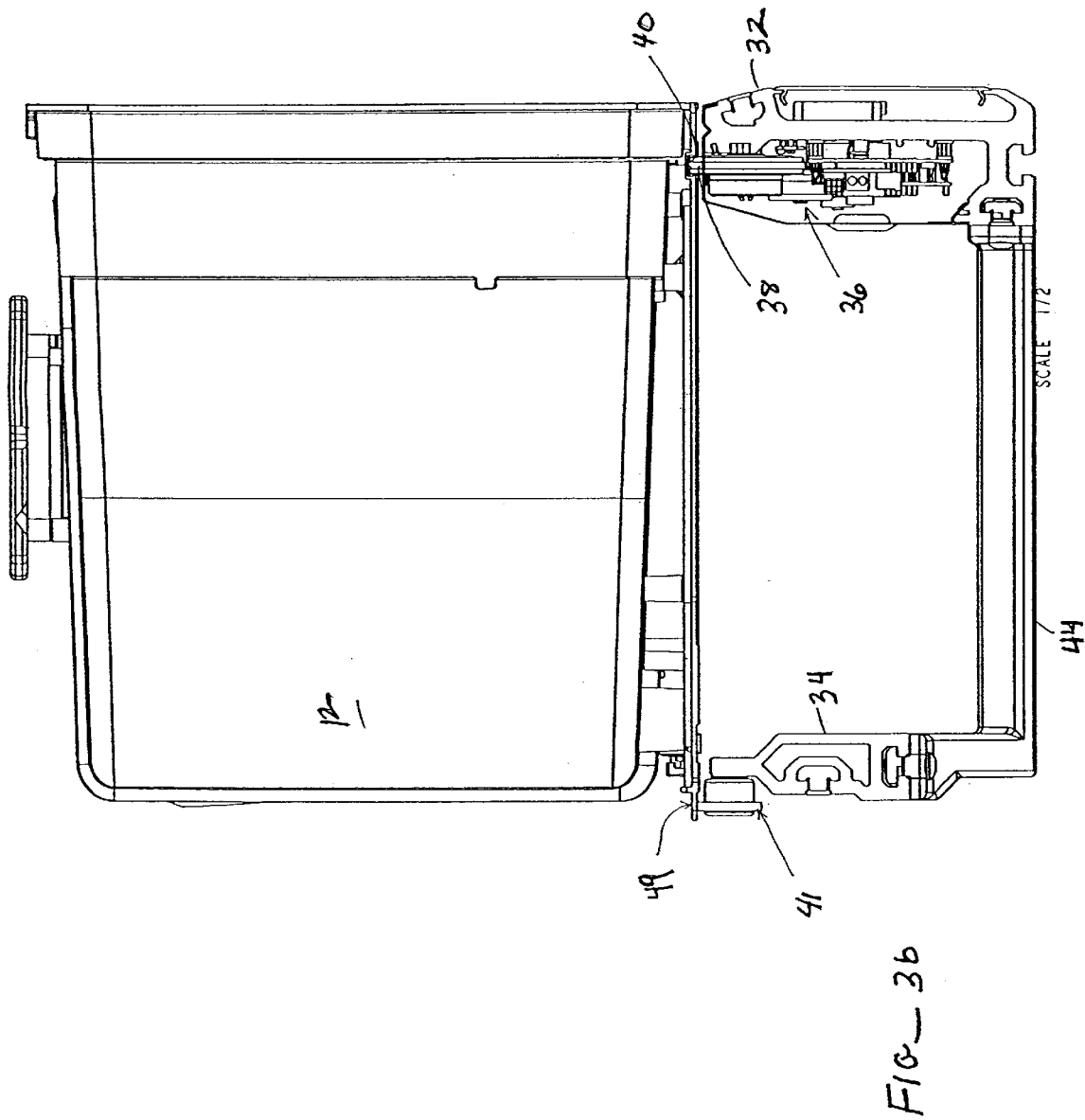

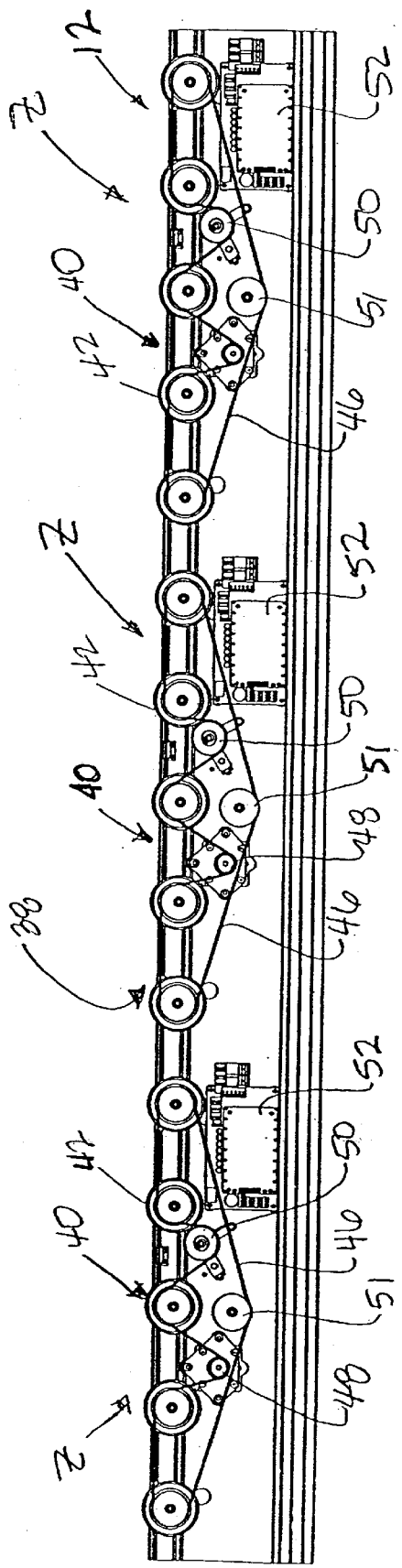
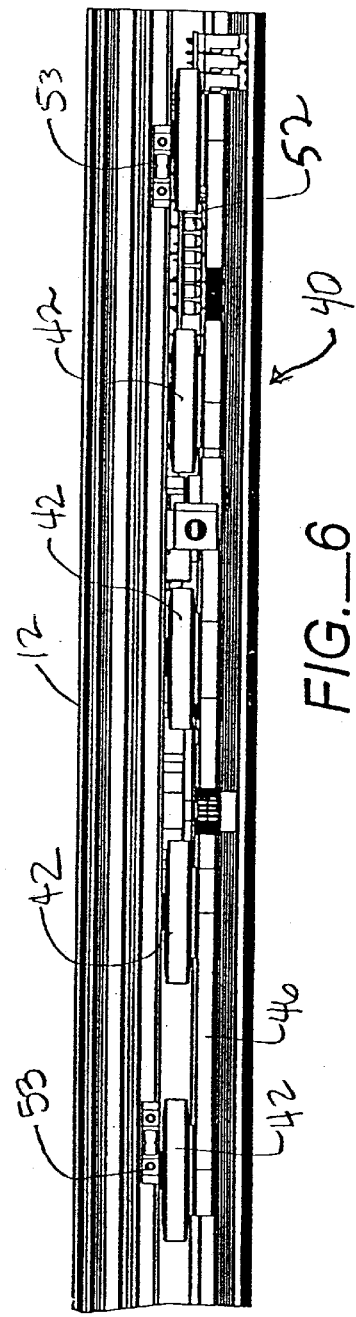
FIG._4
FIG._6

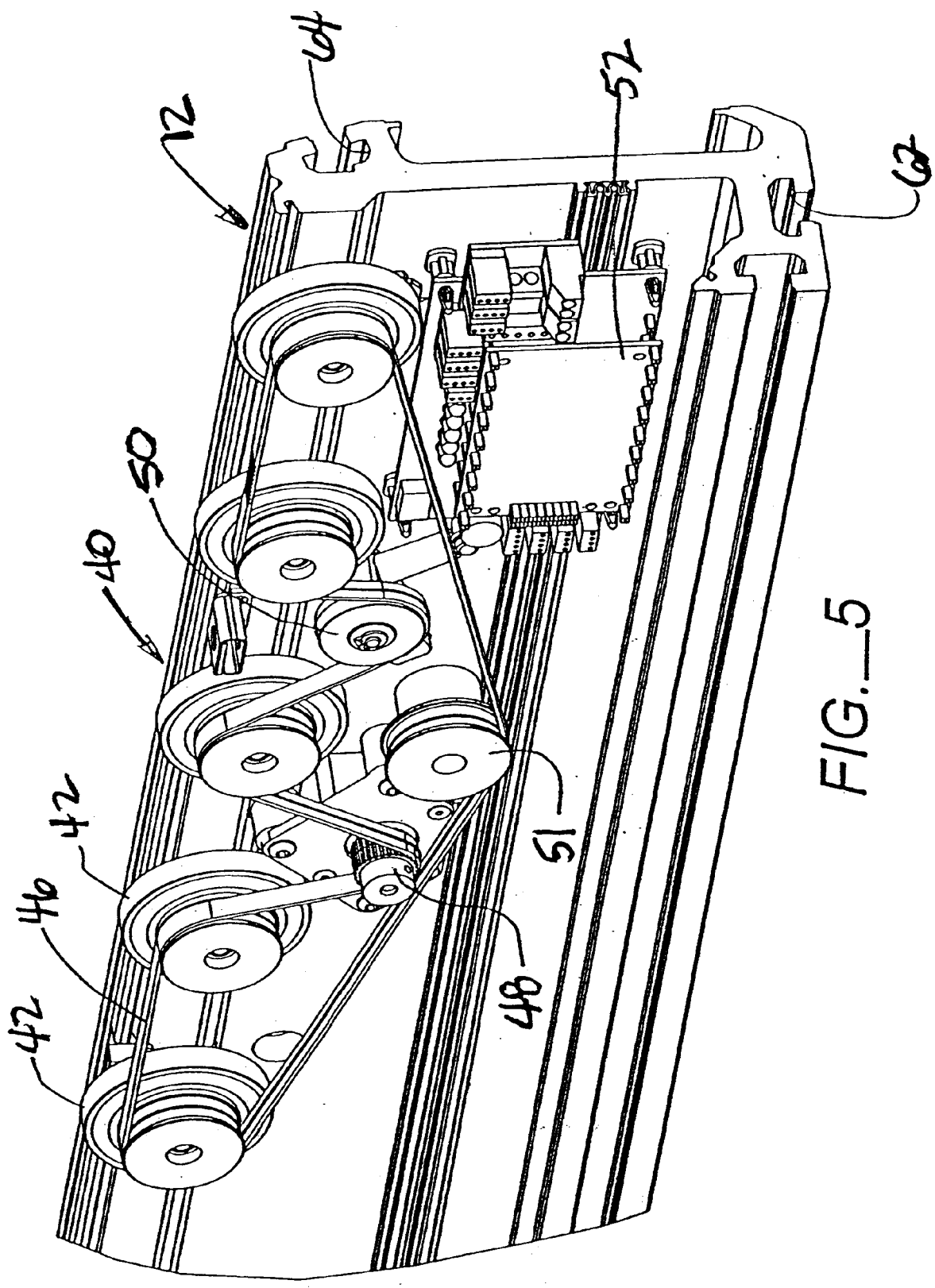
FIG._5

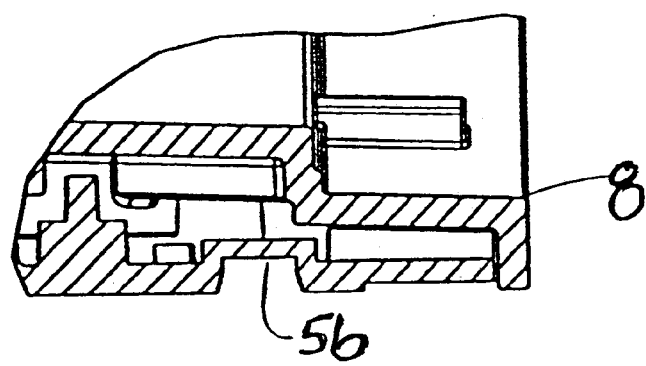
FIG._7
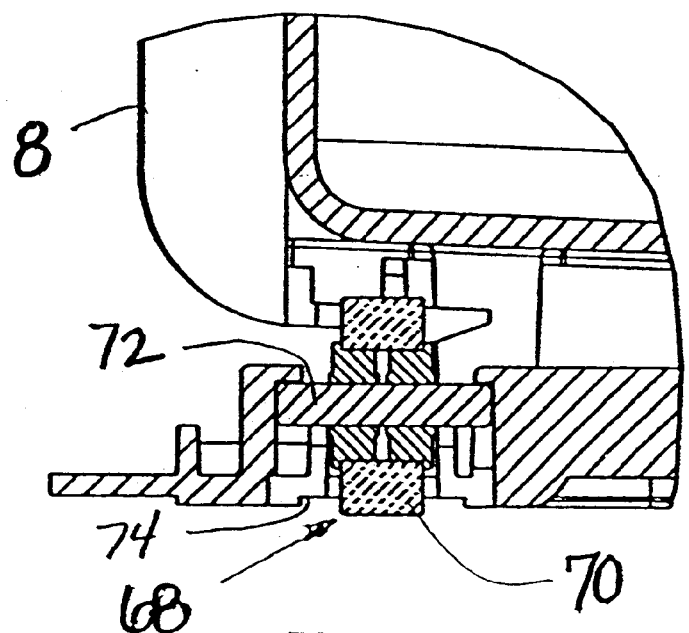
FIG._8

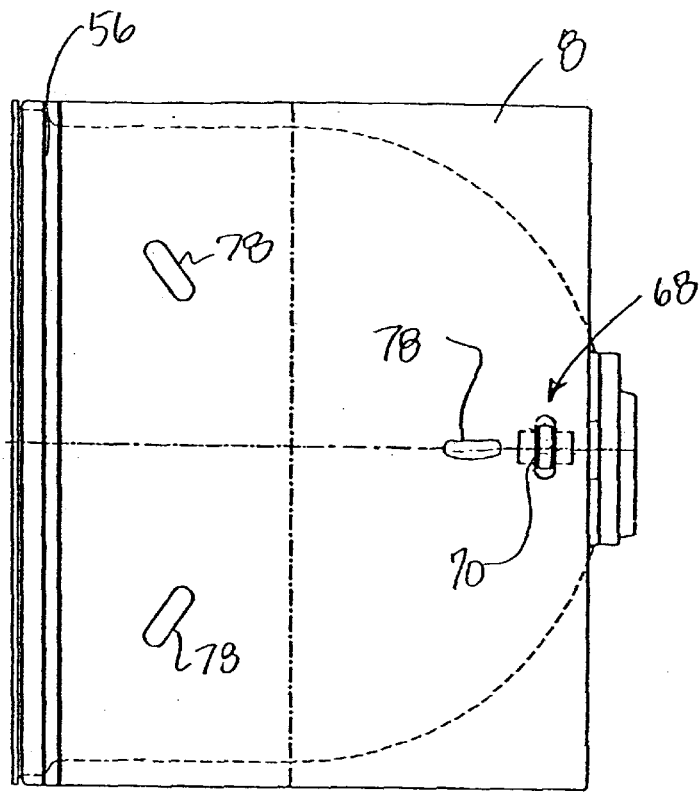
FIG._9
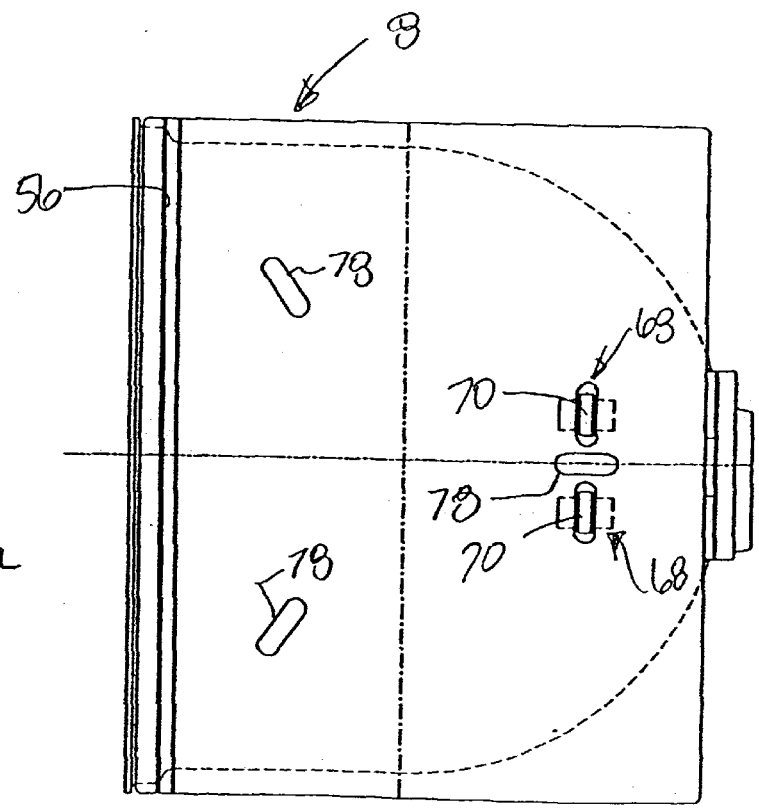
FIG._10a

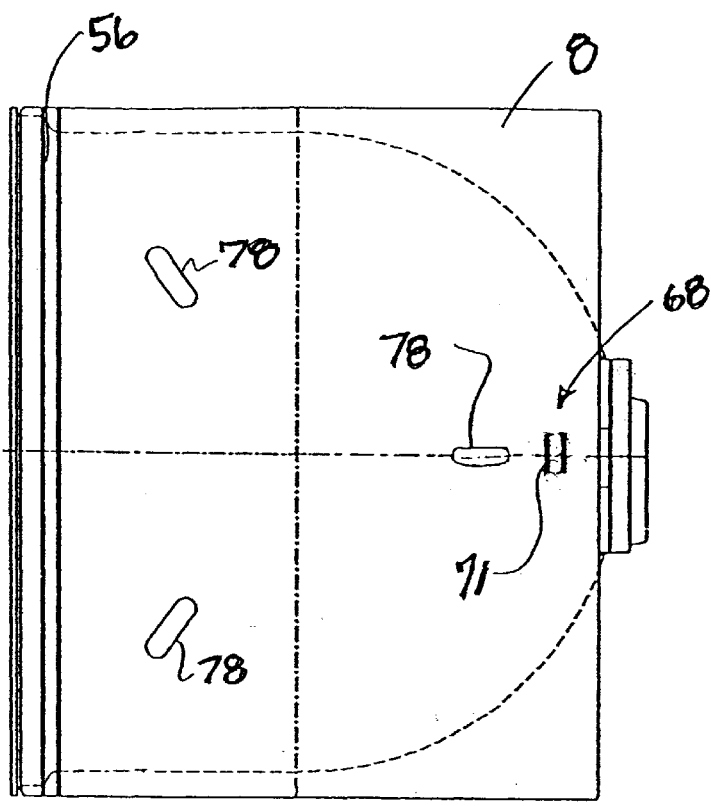
FIG._10 b

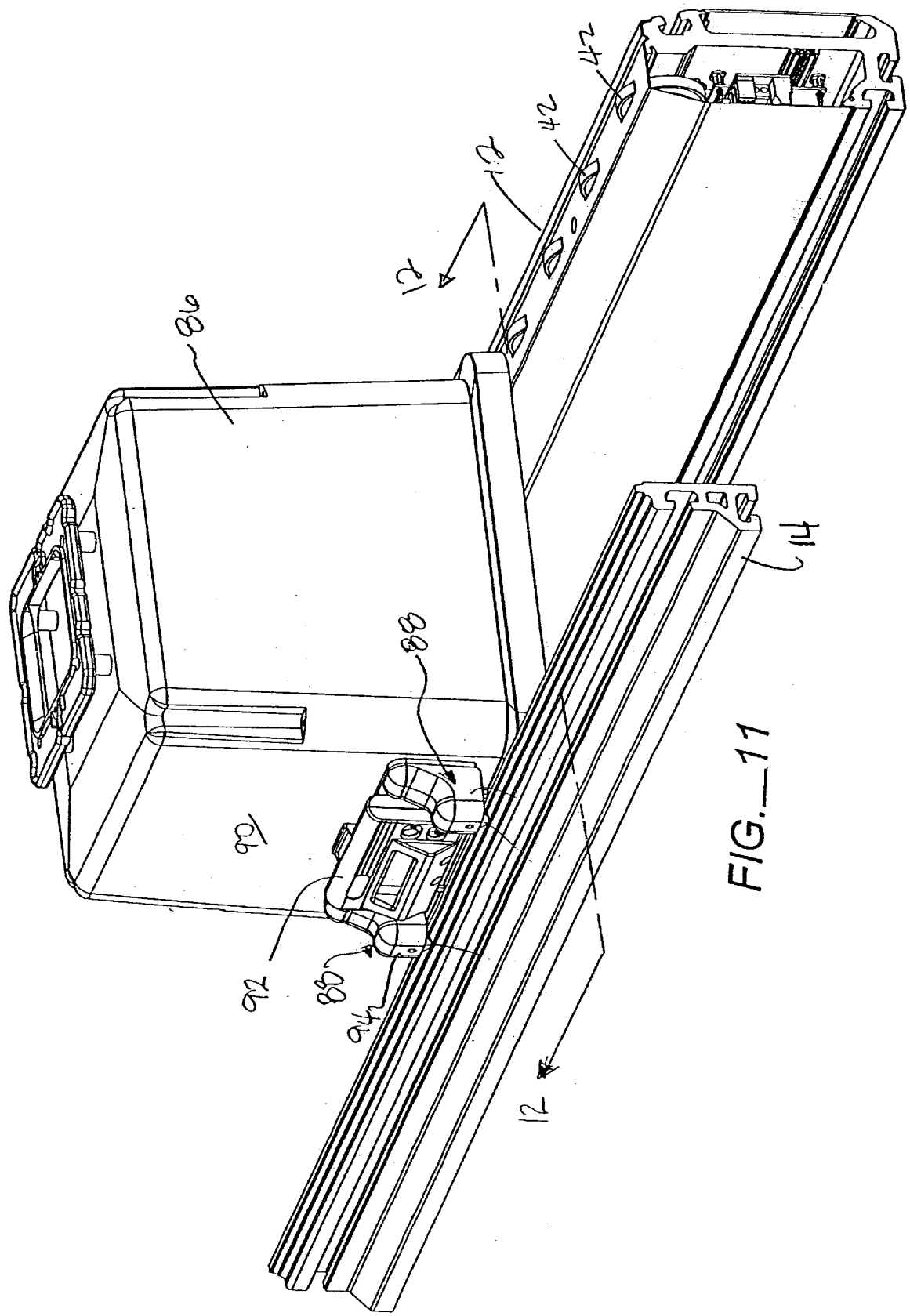
FIG._11

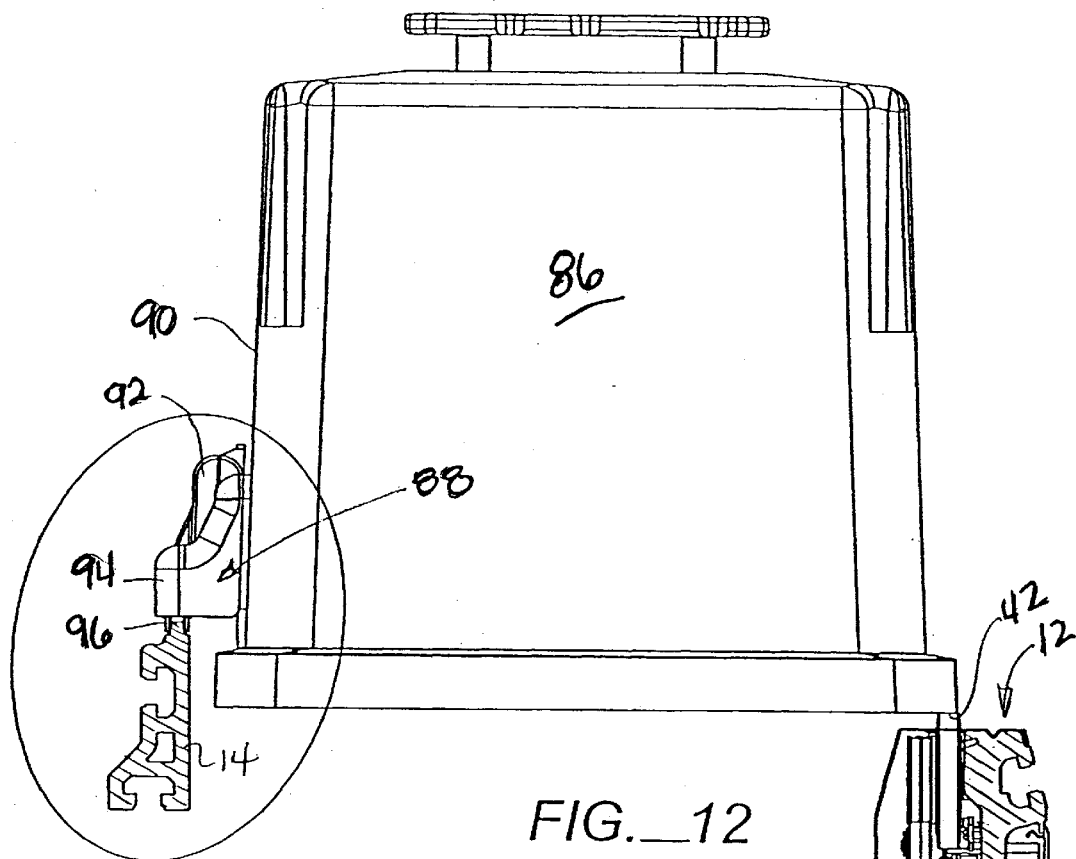
FIG. _12
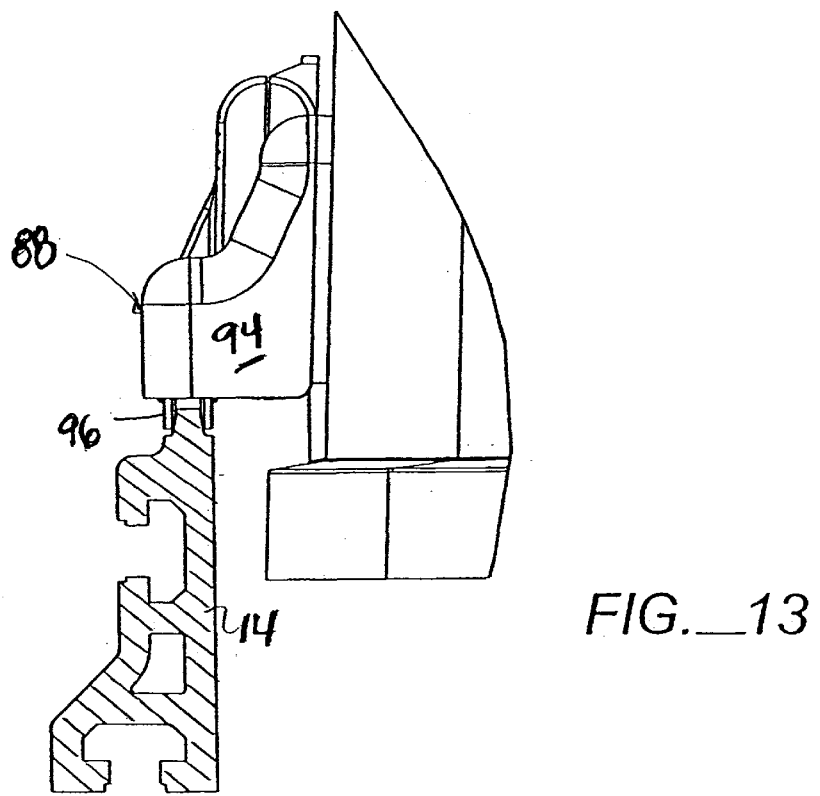
FIG. _13

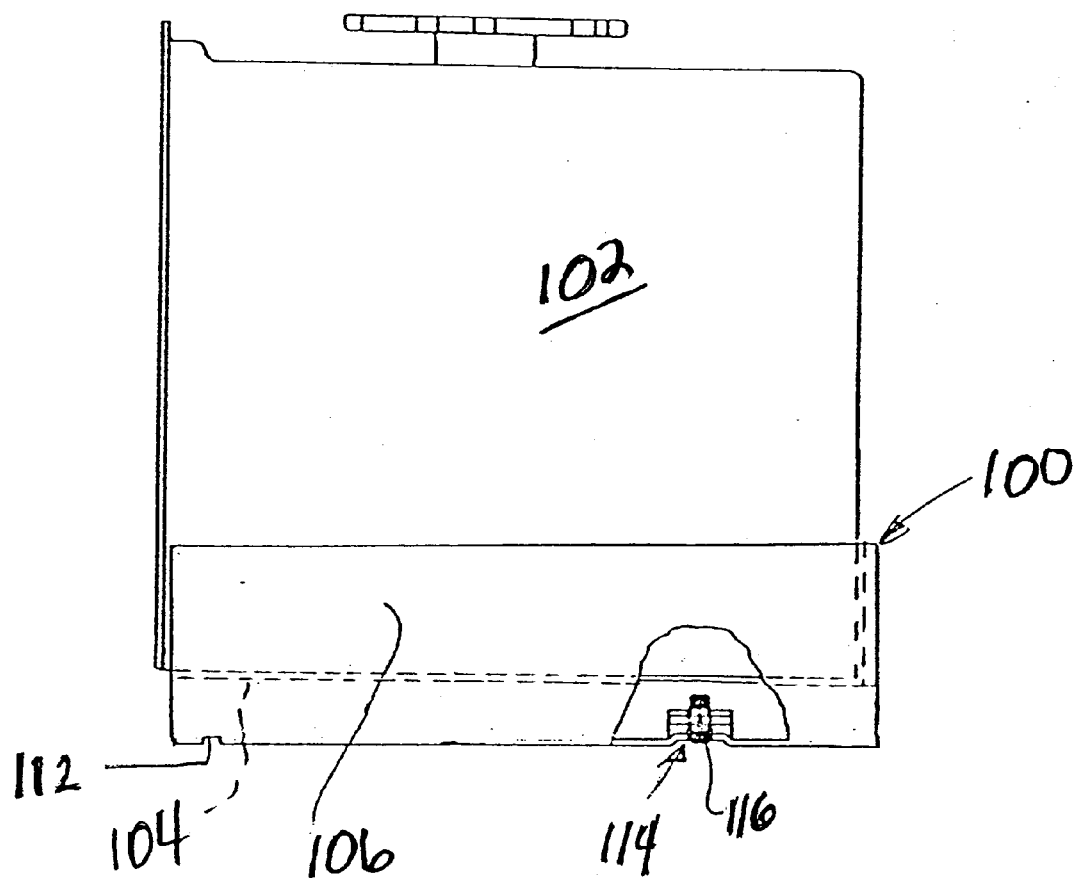
FIG._14
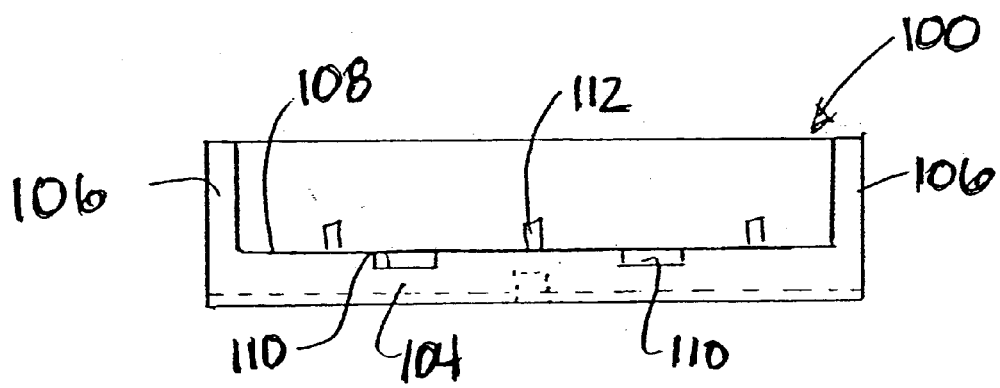
FIG._15

INTEGRATED TRANSPORT CARRIER AND CONVEYOR SYSTEM

This application is a continuation of Ser. No. 09/466,989, filed Dec. 10, 1999, which is a continuation-in-part of U.S. patent application Ser. No. 09/103,479 filed Jun. 24, 1998, now U.S. Pat. No. 6,223,886, the entire disclosure of which is hereby incorporated by reference.

BRIEF DESCRIPTION OF THE INVENTION

The present invention relates in general to a system of transporting articles between stations and, more particularly, to a transport system for safely moving delicate or valuable articles between work stations.

BACKGROUND OF THE INVENTION

In various fields, delicate or valuable articles must be safely transported between work stations and the like without damaging or destroying the articles. Articles requiring careful handling include, but are not limited to, pharmaceuticals, medical systems, flat panel displays, computer hardware as for example disc drive systems, modems and the like, semiconductor wafers and lithography reticles.

In general, integrated circuits are manufactured by forming a plurality of layers on a substrate such as a semiconductor wafer. A variety of processing machines are used to form the individual layer, with the wafer typically being delivered to several different machines before the integrated circuits are completed. In addition to equipment for depositing films on the wafer, the semiconductor wafer may also be cleaned, conditioned or measured at various stages by suitable equipment. With advances in technology, integrated circuits have become increasingly complex and typically include multiple layers of intricate wiring. The size of the integrated circuits has decreased, greatly increasing the number of such devices on a single wafer. As a result of the increased complexity and decreased size of the integrated circuits, the value of the semiconductor wafer increases substantially as the wafer progresses through the various processing stages. The standard diameter of the semiconductor wafers will increase from 200 mm to 300 mm or larger in the next few years, further increasing the number of integrated circuits which may be formed on a single wafer and therefore the value of each wafer. Considerable care must be taken in handling the semiconductor wafers, particularly during the later processing stages, since a damaged wafer could result in considerable monetary losses. The semiconductor wafers must be retained in a clean room environment, substantially free of particulate contamination, to preserve the purity of the layers deposited on the wafer. The requirement of a clean room environment places additional constraints on the handling of the semiconductor wafers.

For additional protection against contaminants, the semiconductor wafers are typically retained in sealed transport containers, such as pods, as they are moved throughout the manufacturing facility to minimize any exposure to the environment outside of the processing machines. The manufacturing facility is usually organized into a plurality of bays each including several processing machines. After the wafers in a pod have been treated at one or more of the machines, the pod leaves the bay and is transported to the next processing bay. Thus, there are essentially two types of transport loops in the manufacturing facility—the inter-bay loop in which the pods are moved between the bays, and the intra-bay loop in which the pods are moved between the processing machines of a single bay. It is also possible that these two types of transport loops could be merged into one monolithic system with appropriate control and transfer mechanisms (which would eliminate the stocker handoff between the two). In either case, a transport system which may be used to conveniently, safely and efficiently handle and transport the containers is desirable. A transport system which maximizes the utilization of the machines in the processing bay is also desirable.

Various transporting systems have been employed to transport the pods from bay to bay along the inter-bay loop of a manufacturing facility. Because of the amount of traffic in the inter-bay loop of the manufacturing facility, inter-bay transport is typically accomplished via overhead transport systems. The pods are delivered to a robotic storage house, often referred to as a "stocker", which receives the pods and automatically delivers the pods to the intra-bay loop. With some systems, the inter-bay transport system is coupled to the intra-bay transport system for direct transfer between the systems. However, direct transfer may be obtained only when a compatible, overhead transport system is used in the intra-bay loop.

Within the bays, the transport pods must be carried from machine to machine and delivered to a position where the wafers may be unloaded from the pod by the machine for processing. The machine entrance is often provided with a load port where the wafers may be automatically removed from the transport pod in a protected environment. Transferring the pods to the load port requires greater precision and control over the pod than moving the pods between the inter-bay conveyor and the bays. Various methods are employed to move the transport pods between the different processing machines in a bay. For example, many systems rely upon human workers to transfer the transport pods from port to port using a cart. The worker may manually lift the pod to the port. Alternatively, the worker may actuate a manual robotic link or other lifting device to move the pod to the port and, after processing has been completed, to return the transport pod to the cart. The worker then moves the cart to the next machine and repeats the process. Relying on human workers to transport the pods from machine to machine is time consuming and inefficient. Often, the worker will not be on hand to position a pod of fresh wafers in the load port and the machine will sit in a stand-by mode reducing the time during which the machine is operating and the overall efficiency of the processing factory. Moreover, care must be taken to ensure the lifting device is properly aligned with the load port as dropping the pod or exposing the pod to sharp jolts may damage the wafers and could cause up to millions of dollars of damage. A means of automatically moving the transport pods between machines is desirable.

Another system of intra-bay transport relies upon automatic guided vehicles (AGVs) which carry the pods between the machines and move the pods into the load port. Using AGVs reduces the need for a worker in the bay and may increase the speed at which the pods are moved through the bay. However, the size of the bay limits the number of AGVs which may operate in a single bay, leaving the machines in a stand-by mode waiting for the AGV to remove the pod of processed wafers and deposit a pod of fresh wafers in the transfer bay. An automated system which may be used to rapidly deliver pods to and remove pods from the processing machines without leaving the machines in a stand-by mode is desirable.

Overhead monorail systems are also used to transport pods along the intra-bay loop. Hoists or similar devices are used to lower the pods onto the load port of the processing machine. In order to successfully transfer the pod from the monorail to the machine, the pod must be precisely aligned with the load port and lowered onto the port in a controlled manner such that any swing of the pod is minimized. After processing, the pod is raised and transported to the next machine. Repeatedly raising and lowering the pod is challenging. An automated conveyor system which positions the pod for direct, efficient transfer to the load port is desirable.

Transport systems for transporting materials are well known. Examples of standard transport systems include conveyor belt systems and roller systems where the articles are transported across a plurality of rotating rollers or wheels. While these systems provide a useful means of transport in most circumstances, they are not suitable for transporting pods in a clean room environment. Moreover, these systems do not offer precise control over the acceleration and deceleration of the pod which is required to prevent shifting of the wafers within the pods.

Another type of transport system which may be adapted for clean room use includes a pair of spaced rails each having a drive system for supporting an article and propelling the article along the rails. The competition between the two drive systems may cause the article to shimmy as it moves along the rails. A modification of this transport system includes a drive system on one rail and guide wheels on the other rail to allow the article to move freely along the rails. Unless the drive system, guide wheels and features of the transport pod are in exact, horizontal alignment, the guide wheels may cause the article to tip slightly such that each guide wheel imparts a slight impact on the article. While these adverse effects may be a minor inconvenience for most articles, the vibrations can have adverse effects on the delicate, expensive semiconductor wafers carried by the transport pod. A transport system for safely and protectively transporting semiconductor wafers is desirable.

SUMMARY OF THE INVENTION

In summary, the present invention provides a system for transporting one or more articles, including a conveyor system, an article transport carrier (also referred to as a transport carrier) and a method of transporting the articles. The conveyor system includes an article transport carrier which carries the article between workstations. The article transport carrier may carry a container such as but not limited to a transport pod which houses the articles, or the article transport carrier may carry the articles directly. The conveyor system also includes a drive rail and a support rail for supporting the article transport carrier. The drive rail includes a drive system for propelling the article transport carrier between workstations. At least one shoe, such as a wheel, fixed support or groove is carried by the article transport carrier. The shoe is configured to ride on the support rail for movably supporting the article transport carrier on the support rail.

The article transport carrier may include a protective carrier for carrying one or more articles or empty containers along the conveyor system. The carrier may include a housing having an interior compartment and a surface which is positionable on the drive and support rails of the conveyor system. In a preferred embodiment, a bottom surface of the housing is positionable on the drive and support rails. In this case, the bottom surface of the housing is configured to engage the drive system such that actuation of the drive system propels the housing along the drive and support rails. Alternatively, another surface of the housing, such as a side surface, may be positioned on the drive and support rails. The interior compartment is configured to retain one or more articles, for example semiconductor wafers. At least one shoe is carried by the housing. The shoe is configured to ride on the support rail of the conveyor system to movably support the housing on the support rail.

The method of the invention includes the steps of providing an article transport carrier for holding at least one article and having a base and at least one shoe, and positioning the transport carrier with the base of the transport carrier supported on a drive rail and the shoe carried by the transport device supported on a support rail of a conveyor system. The method also includes the step of actuating a drive system carried by the drive rail to propel the transport carrier along the drive rail and support rail.

In another aspect of the invention a transport system is provided for transporting articles comprising a conveyor having a drive rail and a support rail parallel to and spaced from the drive rail. A transport carrier, configured to ride on the conveyor, includes a guiding feature or surface which interfaces with one of the drive or support rails for guiding the transport carrier along the conveyor.

Additional objects and features of the invention will be more readily apparent from the following detailed description and appended claims when taken in conjunction with the drawings.

BRIEF DESCRIPTION OF THE DRAWINGS

FIG. 1a is a pictorial view of a section of a conveyor system in accordance with the present invention.

FIG. 2 is a schematic view of an example of an inter-bay loop of the conveyor system of FIG. 1.

FIG. 3a is a sectional view taken substantially along line 3a—3a of FIG. 1a.

FIG. 3b is a sectional view taken substantially along lines 3b—3b of FIG. 1b.

FIG. 4 is a plan view of a section of the drive rail of the conveyor system of FIG. 1.

FIG. 5 is an enlarged, pictorial view of a section of the drive rail of FIG. 4.

FIG. 6 is an enlarged top plan view of the drive rail of FIG. 4.

FIGS. 7 and 8 are enlarged, sectional views of portions of one embodiment of the transport carrier of FIG. 3a.

FIG. 9 is a bottom plan view of the transport carrier of FIG. 1.

FIGS. 10a and 10b are bottom plan views of two other embodiments of a transport carrier.

FIG. 11 is a pictorial view of a conveyor system in accordance with another embodiment of the present invention.

FIG. 12 is a cross sectional view taken substantially along line 12—12 of FIG. 11.

FIG. 13 is an enlarged, sectional view of the circled area of FIG. 12.

FIG. 14 is a side plan view of another embodiment of a transport carrier in accordance with the present invention.

FIG. 15 is a front plan view of the transport device of FIG. 14.

DETAILED DESCRIPTION OF THE INVENTION

Figure 1B:
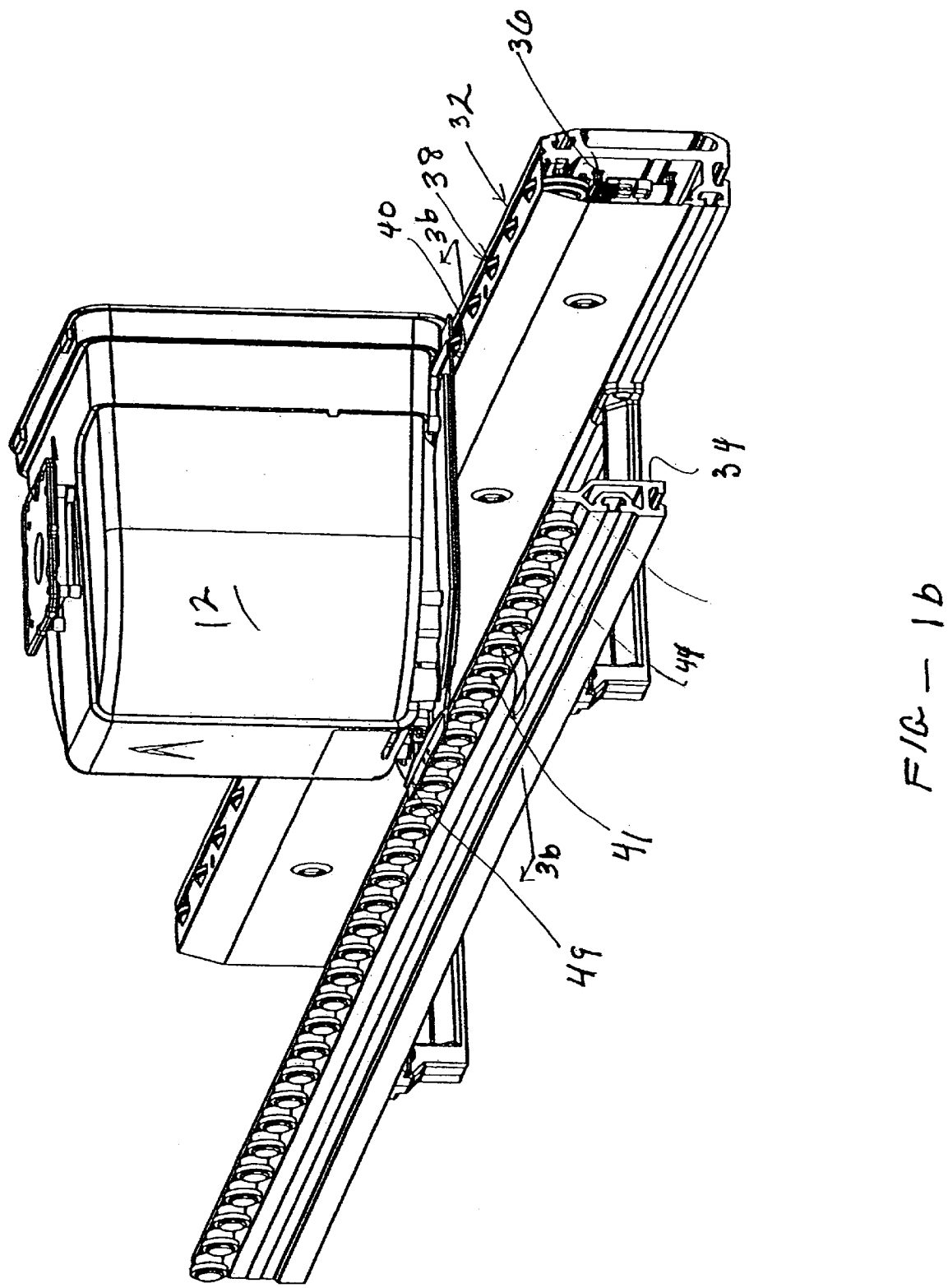
FIG. 1b is a pictorial view of a section of a conveyor system in accordance with an alternative embodiment of the present invention.

A detailed description of the invention will now be given with reference to the accompanying figures. Turning now to the drawings, wherein like components are designated by like reference numerals throughout the various figures, attention is directed to FIGS. 1 and 2.

FIGS. 1a and 1b show two embodiments of a section of a conveyor system 10 constructed in accordance with the present invention, while FIG. 2 schematically illustrates an example of a possible layout configuration for the conveyor system 10. The conveyor system 10 provides a safe, efficient transport mechanism for moving articles or an article transport carrier. In the illustrated embodiment, one or more semiconductor wafers W (FIG. 3) are held in a protective environment of an article transport carrier 8, which in one example may include, or optionally be comprised of, a container or pod for transport. Many types of carriers may be used. The terms "pod" or "container" may be used throughout the specification; however, it is to be understood that the term is not to be limited to a holder for wafers but is intended to encompass any type of carrier for housing any type of articles. In addition to wafer transport, it is to be understood that the system of this invention may be used to transport other types of materials, particularly delicate materials where substantial care must be taken in handling the materials such as pharmaceuticals, medical systems, flat panel displays, hard disk drives and other types of computer equipment. The conveyor system 10 is designed to meet the strict requirements for operation in a clean room environment. However, the system may also be used in other environments where elimination or minimization of particulate contamination is not an issue.

Figure 3A:
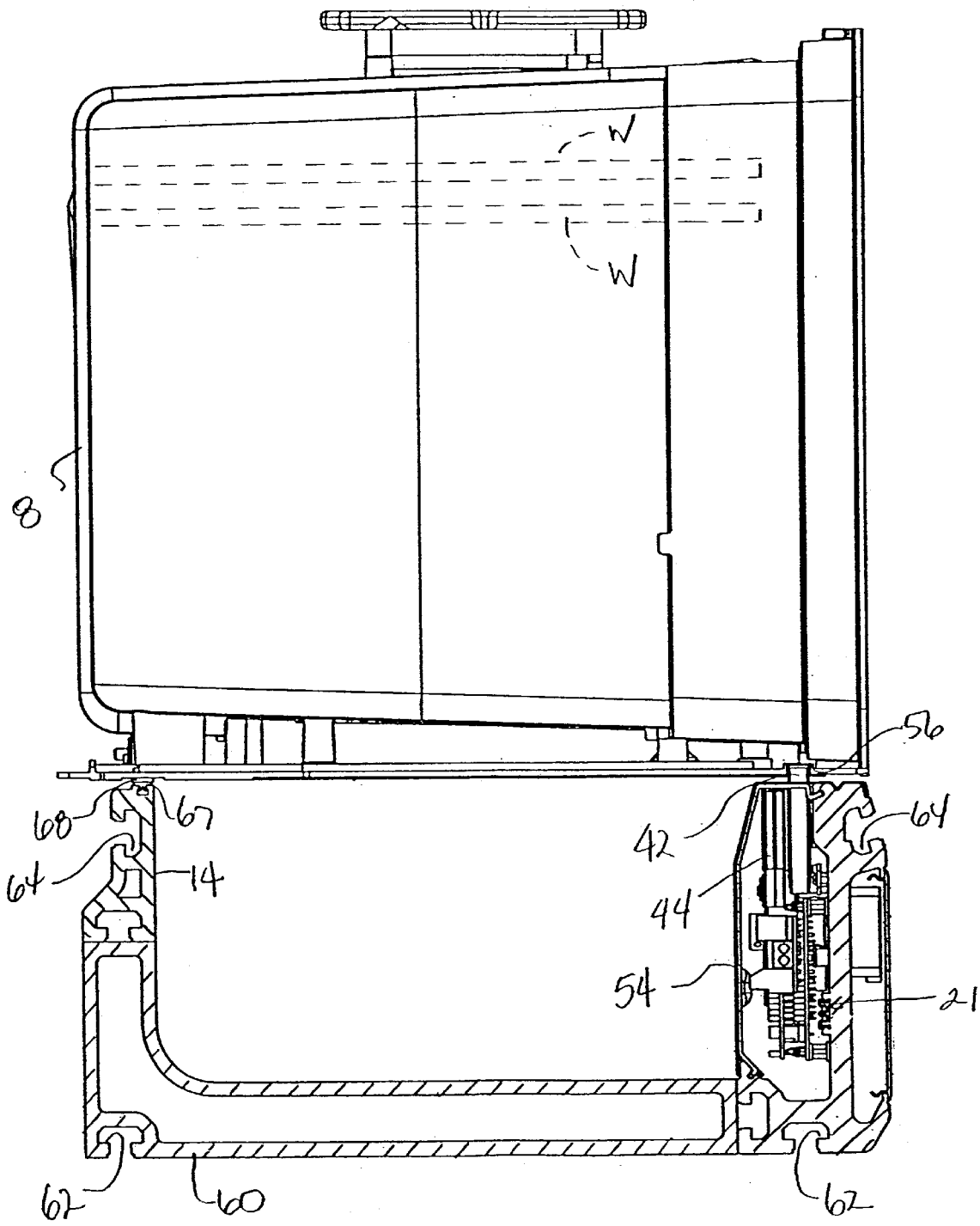

As shown in FIGS. 1a and 1b, the conveyor system 10 generally includes a pair of rails 12, 14 for supporting the transport carrier 8 as it is moved along the conveyor path. The rail 12 functions as a drive rail which propels, and optionally may also guide the transport carrier 8 along the rails 12, 14. All propulsion power for moving the carrier 8 is supplied via the drive rail 12. Power may be supplied to the drive rail 12 via conventional means. Alternatively, power may be supplied to the drive rail 12 by a power bus 21 (shown in FIG. 3a). Rail 14 is an idler or support rail with the sole function of supporting the transport carrier 8 such that the carrier 8 is held in a level orientation as it is moved along the conveyor path. The conveyor system 10 also includes a transport device for moving the wafers or other materials. As is discussed in more detail below, in the present embodiment the transport device cooperates with the drive rail 12 to constrain movement of the device in both the vertical and lateral directions, while the idler rail 14 cooperates with the transport device to constrain only vertical movement of the transport device. In this embodiment, as shown in FIGS. 1a, 1b and 3, the carrier housing the article, is part of the transport carrier 8. In other embodiments of the invention, as shown for example in FIG. 8, the conveyor system 10 includes a transport device 80 which may be used to carry a transport carrier, container, or one or more other articles along the conveyor path. In this embodiment, the front of the carrier 8 rests on the drive rail 12 while the rear portion of the carrier is supported by the idler rail 14. However, it is to be understood that this configuration could be reversed, with the idler rail being positioned toward the front of the carrier 8 and the drive rail 12 supporting the rear portion of the transport pod. In addition, in an alternative embodiment, the idler rail 14 may provide guidance, that is the idler rail 14 would cooperate with the transport device to constrain movement of the device in both the vertical and lateral directions, and in this instance the drive rail 12 would constrain only the vertical movement of the transport device.

Of particular advantage the present invention provides for guiding the transport device by only one rail, either the drive rail or the idler rail. Prior art systems typically guide the device by two rails. This prior art system is subject to many problems, for example the rails must be precisely aligned and any variations in the tolerance and/or alignment of the rails will disrupt smooth travel of the transport device. The present invention solves this problem by guiding the transport pod by only one of the drive or support rails, and by supporting the transport device in a level orientation with the other rail.

Thus, in another aspect of the invention a transport system is provided for transporting articles comprising a conveyor having a drive rail and a support rail parallel to and spaced from the drive rail. A transport carrier, configured to ride on the conveyor, includes a guiding feature or surface which interfaces with one of the drive or support rails for guiding the transport carrier along the conveyor. The guiding feature or surface may take any suitable form. In one example the guiding feature may include a groove formed in a surface, such as the bottom surface, of the transport carrier. In another example, the guiding feature may be comprised of the shoe carried by the transport carrier.

As shown in FIG. 2, and described in more detail below, the conveyor system 10 is particularly suitable for simultaneously transporting a plurality of transport carriers 8 or other transport devices. Four carriers 8 are shown in FIG. 2 for illustrative purposes. However, it is to be understood that the number of transport carriers 8 carried by the conveyor system 10 may be increased dramatically. In the example shown in FIG. 2, the drive rail 12 and idler rail 14 are arranged in an intra-bay loop 18 which includes one or more cross sections 20 which may be used to transfer the carriers 8 from one part of the loop 18 to another without requiring that the carrier traverse the entire loop, providing greater flexibility in the movement of the carriers 8. This arrangement may be useful where a manufacturing facility has duplicate processing machines. However, for bays in which each carrier must be delivered to each processing machine in succession, a simple continuous loop is preferred as it leaves the middle of the intra-bay loop 18 free for service and maintenance traffic.

In one example the carriers 8 are delivered to the intra-bay loop 18 by a stocker 16, or other transfer mechanism (or by a direct handoff, which receives the carriers from an inter-bay transport system. The inter-bay transport system is preferably elevated to maximize the available space in the inter-bay area for the movement of workers, maintenance and service equipment and the like. The conveyor system 10 of this invention may be used in the inter-bay area, preferably by suspending the conveyor system 10 from an overhead frame, with the conveyor delivering transport pods to the stockers 16. Instead of using the conveyor system 10 of this invention, other types of systems may be used for the inter-bay transport device.

The intra-bay loop 18 transports the carriers 8 between the semiconductor processing machines 22 positioned in the bay. Four processing machines 22 are shown in the bay for illustrative purposes, with the actual number of processing machines located in each bay depending upon the constraints imposed by the specific manufacturing process as well as the physical size of the machines and manufacturing facility. The processing machines 22 may be any of a variety of types of machines used to process and/or measure semiconductor wafers including, but not limited to, deposition equipment and machines for cleaning or conditioning the semiconductor wafers at various stages during processing.

The transport pods 8 are moved between the main leg of the intra-bay loop 18 and the cross sections 20 via intersections 26. The intersections 26 provide a means of redirecting the carrier 8 as it is moved along the drive and idler rails 12, 14. The intersections 26 may take a variety of forms. For example, the transport pod 8 may be redirected by lifting the carrier 8 above the rails 12, 14, rotating the pod 90° to insure the same side of the transport carrier 8 is always aligned with the drive rail 12, and lowering the pod onto a portion of the drive rail 12 of the new path. With other layout designs it may be necessary to rotate or turn the transport carrier 8 by a different amount. If no redirection of the pod is necessary, the carrier 8 is allowed to move across the intersection 26 without changing directions.

With the layout shown in FIG. 2, the intra-bay loop 18 also includes a pair of intersections 28 which join the inward-directed and outward-directed legs of the main path of the intra-bay loop 18. The intersections 28 differ from the intersections 26 in that the intersections 28 are used to redirect the section of the conveyor 10, not to direct the transport carrier 8 between two different sections of the conveyor. The intersection 28 may be constructed to rotate or swing a section of the drive rail 12 to change the orientation of the drive rail 12, with the drive rail 12 propelling the carrier 8 onto and off of the intersection 28. Alternatively, the intersection 28 may include a curved drive rail which turns the carrier around a corner to change the direction of travel. The intersections 28 may also be the same as the intersections 26 if desired.

The layout of the conveyor system 10 shown in FIG. 2 also includes transfer assemblies 30 which automatically move the transport carrier 8 between the intra-bay loop 18 and the load ports 24 of the processing machines 22. In the illustrated embodiment, the drive and idler rails 12, 14 are generally located at the level of the load ports 24. The transfer assembly 30 includes a lifting mechanism which lifts the transport carrier 8 above the drive and idler rails 12, 14, separating the pod from the rails. The transfer assembly 30 also includes a drive system which propels the carrier forward until it is properly positioned above the load port 24, the proper position being determined by the design of the load port. Other types of transfer assemblies may also be used to transfer the transport carrier 8 from the conveyor to the load port 24. Instead of depositing the pod on the load port 24, it is to be understood that the transfer assembly may be designed to support the transport pod or other article at the machine 22 or other workstation.

Using the conveyor system 10 of this invention, the transport carriers 8 may be efficiently and conveniently transported between the processing machines within each bay. The transport carriers 8 are automatically coupled to the load port 24 of each machine 22 for unloading and processing of the wafers. After the carriers 8 have been automatically filled with the processed wafers, the carriers 8 are automatically returned to the rails 12, 14 and moved along the intra-bay loop. The carriers 8 are safely and securely supported by the conveyor system 10, the intersections 26 and 28 and the transfer assemblies 30 as the carriers are manipulated within the bays, protecting the delicate, expensive wafers from becoming damaged or destroyed during handling. Moreover, the transport carriers 8 are accelerated, decelerated, and positioned in a gentle, controlled manner which minimizes the stresses imposed on the wafers by the motion of the transport carriers 8.

The conveyor system 10 of this invention is described in more detail in relation to FIGS. 1a, 1b and 3a and 3b–10. As shown particularly in FIGS. 3a and 3b, the transport carrier 8 is supported by the drive rail 12 and the idler rail 14. The drive rail 12 includes a drive system, generally designated at 38 in FIG. 4, for propelling the carrier 8 along the rails 12, 14. In the illustrated embodiment of the invention, the drive system 38 includes a plurality of separate drive assemblies 40. One drive assembly 40 is shown in FIG. 5. In this embodiment, the drive assembly includes a plurality of drive wheels 42 which frictionally engage the underside of the transport carrier 8 to propel the transport carrier 8 along the drive rail 12. The drive assembly 40 includes a plurality of spaced-apart drive wheels 42. As shown in FIG. 4, the drive assemblies 40 are located along the rail such that the separation between the outermost drive wheels 42 of adjacent drive assemblies 40 is substantially equal to the spacing between the drive wheels 42 of the individual drive assembly 40. However, it is to be understood that the spacing between the drive assemblies may be increased or decreased so long as the transport carrier 8 can straddle the gap between the drive assemblies 40 and still contact at least one wheel 42 of each assembly 40. The drive wheels 42 project upwardly from the drive rail housing 54 such that it is the drive wheels 42 of the rail 12 which directly support the transport carrier 8. The wheels 42 are preferably mounted at approximately the same height to minimize tipping or rocking of the carrier 8 as it is moved along the rails 12, 14. In the present embodiment, the drive system 40 includes five wheels 42. However, it is to be understood that in other modifications of the invention, the drive assemblies 40 may have a greater or lesser number of wheels. Further, the size of the wheels may be increased or decreased.

A hub 44 projects outwardly from the drive wheel 42 as shown particularly in FIGS. 3a and 3b. A drive belt 46, shown particularly in FIGS. 4 and 5, extends around the hubs 44 of the drive wheels 42 to couple the drive wheels to a motor 48. The motors 48 may be capable of clockwise and counterclockwise directions of rotation, allowing the transport pods 8 to be moved forward or backward along the rails 12, 14 upon receipt of appropriate signals. The drive system 40 may also include at least one tensioner pulley 50 for maintaining a uniform belt tension and at least one idler pulley 51. Of course, the drive system may employ other suitable components instead of those given in this specific example.

The drive assemblies 40 operate independently, providing greater control over the movement of the transport carrier 8. In the present embodiment, the drive system 38 is composed of a plurality of operational zones Z, with each zone Z including one drive assembly 40. However, in other embodiments of the invention the zones may each include more than one drive assembly 40. The drive speed and direction (forward or reverse) of each zone is independently controlled. The drive systems 40 of adjacent operational zones are accelerated and decelerated such that at the time of transfer, the speed imposed on the transport carrier 8 by the adjacent drive assemblies 40 is synchronized at the time of transfer between the zones. When a carrier 8 is being propelled along the conveyor, only the operational zone directly below a carrier 8 and one or more zones adjacent the carrier 8 are in active motion at any time; that is, only the drive assemblies 40 in these zones are in operation. This reduces the power consumption of the system and extends the operational life of the drive assemblies 40. The drive zones below and adjacent to other carriers may be held in a stationary mode (sometimes referred to as an inactive mode), allowing a plurality of carriers to accumulate in an area of the conveyor, such as before one of the processing machines 22. The moving carriers are preferably separated by at least one empty zone, in which there is no carrier, to provide a buffer between carriers 8 and protect the carriers against inadvertently bumping into one another. The spacing between the carriers is preferably increased as the velocity of the carrier increases to provide a safe stopping distance at all times. When they are not in motion, the carriers may occupy adjacent drive zones.

Each zone includes one microprocessor or control device 52 for controlling operation of the drive assembly 40 in that zone. The control device 52 is coupled to a control system (not shown) which controls overall operation of the invention. The configuration of the control system is subject to considerable variation within the scope of this invention. For example, the control system may include a computer for controlling operation of the conveyor 10, intersections 26 and 28, and transfer devices 30 within each bay, with the computer being coupled to the control devices 52 of each of the drive zones as well as the control devices of the intersections 26, 28 and transfer devices 30. The computer may also monitor the status of the load ports 24 and, when the ports are filled, stop the approaching transport carriers 8 at spaced apart locations upstream from the filled load port to prevent collisions between the carriers. The computers of each bay may be stand-alone systems or the computers may be part of a network which includes the control systems for the inter-bay conveyor, the stockers, and other automated components of the manufacturing facility. The central control system of the processing facility may also monitor the processing machines.

As shown in FIG. 6, each zone includes at least one sensor 53 for detecting the presence of a carrier 8 within the zone. In the present invention, a pair of sensors 53 are provided in each zone. The sensors 53 are located near the entrance and exit of the zone to detect when the pod enters and leaves the zone. This data on the location of the carrier 8 is used to activate the drive zones downstream from the sensor such that the wheels 42 are active and operating at the same speed as the wheels 42 in the previous zone when the carrier reaches the zone. The data is also used to deactivate drive assemblies after the carrier 8 has left the operational zone. The time required for the carrier to travel between the sensors may be used to monitor the actual speed of the carrier as it travels across the zone, and thus the speed and acceleration/deceleration of the carrier may be determined. The sensors are used to monitor the location of each of the transport carriers 8 and increase or decrease the speed of the individual transport carriers 8 accordingly.

The drive system 38 of the illustrated embodiment provides a clean, efficient drive mechanism for moving the carrier 8 along the drive rail 12 in a precise controlled manner. However, it is to be understood that other types of drive systems may be used in other embodiments of the invention. For example, the drive system may be provided by linear induction motors, with the transport device including a magnet or suitable metal for driving the carrier in response to the linear induction motors. Other drive systems may also be employed. Using the independent drive assemblies 40 of this invention, the movement of several carriers may be independently controlled. Thus, synchronization of the transport carriers 8 along the loops or precise control over the spacing between the carriers 8 along the conveyor system 10 is not required. Using one common drive system would not permit such precise control over the drive speed.

As shown in FIGS. 3a and 3b, the drive wheel 42 cooperates with the transport device, which in this embodiment is part of the transport carrier 8, to propel and guide the carrier 8 along the path. The drive wheel 42 engages a groove 56, or other suitable surface, formed in the underside of the carrier 8. As shown particularly in FIG. 7, in the present embodiment the side rails of the groove 56 are tapered outwardly to minimize contact between the walls of the groove and the drive wheels 42, minimizing friction between the wheels 42 and the groove 56 and reducing wear and tear on the wheels. This is of particular advantage when the conveyor 10 is used in a clean room environment where minimizing sources of particulate contamination is important. However, in non-clean room applications a groove configuration in which there is some contact between the walls of the groove and the wheels may be employed. The groove 56 of this embodiment has a depth of about 5 mm, with the tapered side walls having a height of about 3.5 mm. The width of the bottom of the groove is about 8.5 mm, with the side walls being oriented at an angle of 30°.

The groove 56 defines the horizontal plane in which the carriers sit on the drive wheels 42. The engagement between the drive wheels 42 and the groove 56 controls lateral or side-to-side movement of the carrier 8 as well as vertical movement of the carrier. While the combination of the groove 56 and drive wheels 42 is preferred, it is to be understood that the groove 56 may be eliminated entirely provided the transport device, drive rail 12 or idler rail 14 include a guiding device for guiding the carrier 8 as it moves along the rails 12, 14.

As discussed above, all means of propelling the transport carrier 8 along the conveyor are carried by the drive rail 12. The idler rail 14 cooperates with the transport device, which in this embodiment is part of the transport carrier 8, to support one side of the transport carrier 8. As discussed above, the drive rail 12 controls the plane of the carrier as it sits on the drive rail 12 as well as the lateral position of the carrier. In accordance with this invention, the transport carrier 8 is supported on the idler rail 14 in a manner which minimizes bumping, jolting or shimmying of the carrier 8 as it is propelled along the rails. Thus, the idler rail 14 has little effect, if any, on the smooth, controlled movement of the transport carrier 8 along the rails 12, 14. As shown particularly in FIGS. 1 and 3, the idler rail 14 is parallel to and spaced from the drive rail 12. One or more connectors 60 are mounted to the drive and idler rails 12, 14 to maintain a predetermined spacing between the rails and facilitate installation of the conveyor. The connector 60 may extend the entire length of the rails 12, 14, or the connector 60 may be provided by a plurality of connecting members positioned at intervals along the rails 12, 14. The drive rail 12 and connectors 60 may be mounted to a suitable mounting frame (not shown) or supported directly or indirectly by the process tool or workstation. Alternatively, the drive and idler rails 12, 14 may be suspended from the ceiling by an overhead frame (not shown). The components of the conveyor system are mounted to the supporting structure using suitable means as is known in the art. For example, the conveyor 10 of the illustrated embodiment is provided with a first pair of mounting channels 62 which may be used to mount the conveyor to a floor support frame, and a second pair of channels 64 which may be used to mount the conveyor to an overhead support frame.

The carrier 8 rides along the upper surface of the idler rail 14 as discussed in more detail below. In the illustrated embodiment, a pad or cushion material 67 is provided along the upper surface of the rail 14 to provide the carrier with a smoother ride. Alternatively, a pad, cushion or a resilient material may be incorporated into the outer perimeter of the drive wheels. The pad 67 is formed of a resilient material such as urethane which will not readily shed particles after the conveyor has been in use for extended periods of time. Instead of a pad 67, the carrier 8 may ride directly on the upper surface of the rail 14. The upper surface of the pad 67, or the rail 14 if no pad is employed, is preferably a planar surface having a substantially horizontal orientation. However, the surface may also have a different topography. For example, the idler rail 14 may be in the form of a V-shaped rail. In this embodiment, the idler rail, as opposed to the drive rail, would guide the transport device. In non-clean room applications, the upper surface maybe provided with a longitudinally extending groove (not shown) to ensure the transport carrier 8 does not begin to veer off of the rails 12, 14. This design is not feasible for clean room applications as the groove in the rail 14 provides a trap for dirt and other particulate contamination. The variations in the configuration of the idler rail 14 which may be used to guide the carrier 8 may be provided instead of the groove 56, or in addition to the groove 56 provided they do not compete in guiding the carrier.

As is shown particularly in FIGS. 3a, 3b, 8 and 9, the transport carrier 8 includes a shoe 68 which rides along the upper surface of the idler rail 14. In the preferred form of the invention, the shoe 68 is provided by a wheel 70. However, it is to be understood that the shoe 68 may take other forms including, but not limited to, a fixed support having an anti-friction plastic surface, an air bearing and a magnetic levitation bearing. The wheel 70 is rotatably mounted to the transport carrier 8 via a shaft 72. The shaft 72 may be supported in sealed bearings (not shown) carried by the transport carrier 8, although other means may be used to mount the shaft to the transport carrier 8. The wheel 70 is preferably formed of plastic with integral sealed ball bearings or another material which is suitable for use in a clean room environment. In the illustrated embodiment, where the idler rail 14 includes pad 67, the thickness of the wheel 70 is preferably greater than the width of the pad 67. A narrower wheel may form a groove in the surface of the pad 67 over time, creating a source of friction as the sides of the wheels rub against the pad and a trap for dirt and other particulate contamination. However, it is to be understood that wheels having a width equal to or narrower than the width of the pad 67 may be employed in non-clean room environments. In another modification of the invention, the wheel 70 may be provided with an annular groove of sufficient width to receive the upper surface of the rail 14. The raised edges of the wheel on opposite sides of the groove would extend below the upper surface of the rail 14 and ensure the wheel 70 remained squarely on the upper surface of the rail 14 as the transport carrier 8 is propelled along the conveyor. Preferably, the side walls of the groove in the wheel would be tapered outwardly to minimize contact between the side walls and the sides of the idler rail 14.

In an alternative embodiment shown in FIGS. 1b and 3b, the shoe 68 is provided by a fixed support 49. In this embodiment, the idler rail 14 includes a plurality of rollers 41 for supporting the fixed support 49. The rollers 41 support the fixed support 49 on the underside of the transport pod as its travels along the idler rail 14. Preferably, the fixed support 49 will have an anti-friction plastic surface. In yet another embodiment, the idler rail 14 provides guidance as well as supporting the transport device. To provide guidance, the shoe 68 or the idler rail 14 includes a guiding feature. One example of where a guiding feature is incorporated into the idler rail is the use of a v-rail, described below and illustrated in FIG. 11. Alternatively, the shoe may incorporate a guiding feature. For example, the shoe 68 may be provided by a fixed support having a groove formed therein or the groove being formed in a surface of the carrier as shown in FIG. 10b which engages the rollers 41 on the idler rail 14. It should be understood that while specific embodiments of the shoe are described, the shoe 68 may take many other forms which provide the function of supporting, or supporting and guiding, the transport device.

As shown particularly in FIG. 8, in the illustrated embodiment the wheel 70 mounted to the base of the carrier 8. The wheel 70 is positioned in a groove 74 which is wider than the width of the upper surface of the idler rail 14, and preferably sufficiently wider such that the walls of the groove 74 do not contact the idler rail 14. In this embodiment, the wheel 70 projects from the surface of the transport carrier 8, about 1 mm. However, in other modifications of the invention the wheel may project further than 1 mm or the wheel 70 may be recessed into the groove 74. Moreover, it is to be understood that in other modifications of the invention the groove 74 may be eliminated.

As shown in FIG. 9, in the illustrated embodiment the transport carrier 8 includes a single wheel 70. One limitation on the location of the wheel 70 is the location of the slots 78 on the underside of the carrier which cooperate with the kinematic pins on the load port 24 or other external system to accurately position the carrier 8 on the load port or external system. In the embodiment shown in FIG. 6, the wheel 70 is located near the back edge of the carrier 8 to maximize the spacing between the drive and idler rails 12, 14 for the use of auxiliary devices therebetween, and midway between the sides of the carrier 8 to support the back portion of the carrier 8 in a level orientation and prevent the carrier 8 from tipping and hitting the rail. It is to be understood that the wheel 70 may also be located at different positions.

One shoe 68 is preferred as it offers the advantage of provided a smooth ride along the idler rail 14 with little or no shimmying as the carrier 8 is transported by the drive wheels 42. Other advantages of a single shoe 68 include a minimum number of parts and improved reliability. However, the transport carrier 8 may include a greater number of shoes 68 if desired. FIG. 10a shows an example of a transport carrier 8 which includes two shoes 68. As with the previously described embodiment, both shoes 68 are provided by a wheel 70 which are each rotatably mounted to the transport carrier by a shaft 72. Yet another illustrative embodiment is shown in FIG. 10b. In this embodiment the shoe does not employ a wheel, and instead the shoe 68 includes a groove 71. The groove 71 may engage wheels or rollers on the conveyor.

FIGS. 11–13 show another modification of the invention. In this modification, the article transport carrier 86 again carries the one or more articles directly in a housing. However, it is to be understood that the article transport carrier of this embodiment may instead be provided by a sled, pallet or other device which can support a pod, a container, or one or more other articles. In this embodiment of the invention, the drive wheels 42 engage the bottom surface of the carrier 86 to propel the carrier along the conveyor. The bottom surface of the carrier 86 does not include the groove 56 of the previous embodiment but is instead substantially flat. Thus, while the drive wheels propel the carrier and determine the height or horizontal plane of the carrier, the drive wheels 42 do not control the lateral or side-to-side movement of the carrier.

It is advantageous to have a guiding feature or surface as part of the article transport carrier, in one example as part of the carrier 86. In the exemplary embodiment, the carrier 86 includes a pair of shoes 88 suitable positioned on the carrier, such as mounted to the wall 90 of the carrier 86. In this modification, the carrier 86 includes an information device 92 which is used in the art to store production and/or routing information about the lot as the carrier 86 is moved along the conveyor and the shoes 88 are positioned on either side of the information device 92. Each shoe 88 includes a housing 94 which rotatably supports a wheel 96. As shown in FIGS. 12 and 13, the wheel 96 has a groove 98 formed therein which rides on the v-shaped idler rail 14. The groove 98 and idler rail 14 cooperate to guide the transport carrier 86 as it is moved along the rails 12, 14, thereby controlling lateral or side-to-side movement of the carrier 86. The wheel 96 also controls the vertical position of the respective end of the carrier 86.

As shown particularly in FIGS. 11 and 12, with this embodiment of the invention the idler rail 14 is spaced outwardly of the carrier 86, increasing the gap between the idler rail 14 and drive rail 12 which may be used to accommodate auxiliary devices. The idler rail 14 is also positioned above the drive rail 12. One or more connecting members (not shown) join the idler and drive rails to accurately control the spacing between the rails and to ensure the idler rail 14 is positioned at the proper height above the drive rail 12.

In the previously described embodiments, the transport carrier 8 serves the dual function of the carrier 8 which houses the wafers in a protective environment and the transport device which moves along the rails 12, 14. However, it is to be understood that this invention is not to be limited to a transport carrier which serves this dual role. In another embodiment of the invention, the transport device is separate from the carrier or other container holding the wafers. This modification of the invention is also particularly suitable for use with applications other than semiconductor processing, where the transport carrier may be used to carry one or more articles or a container holding one or more articles. The configuration of the separate transport carrier is subject to considerable variation, depending in part upon the constraints imposed by the particular application. FIGS. 14 and 15 show an example of a transport carrier 100 in accordance with the modified embodiment of the invention. However, the transport carrier is not to be limited to the configuration shown in FIGS. 14 and 15.

The transport carrier 100 is used with the drive and idler rails 12, 14 shown in FIGS. 1–5, and reference is made to the description of these figures. In FIG. 14, according to another embodiment of the present invention the transport carrier 100 is shown holding a transport container or pod 102 which holds one or more wafers. However, it is to be understood that the transport carrier 100 may be used to carry other articles or materials within the scope of this invention, or other types of containers. The transport carrier 100 is provided by a sled which includes a base 104 and side walls 106 which extend upwardly from three sides of the base 104. Although not shown, the base 104 has pins 118 (FIG. 15) formed thereon which mirror the kinematic pins on the load port. The pins 118 engage the kinematic pin slots (not shown) on the underside of the pod to hold the pod in place. The side walls 106 are positioned just outside of the outer walls of the transport pod 102 so that the pod 102 fits snugly within the transport carrier 100, providing additional support and preventing rocking or shifting of the pod as the transport carrier 100 is moved along the conveyor. If desired, other means may be used instead of or in addition to the side walls 106 to securely hold the transport pod 102 on the carrier 100. For example, the carrier 100 may be secured to the sides and/or bottom of the transport pod 102 by bolts or other suitable fasteners. The transport pod 102 may also be secured to the transport carrier 100 using straps or other suitable means of attachment.

The transport pod 102 is positioned on the upper surface 108 of the base 104. If desired, the base 104 may be provided with one or more inward-extending grooves 110 to facilitate loading of the transport pod 102 onto the base 104. The underside of the base 104 is provided with a groove 112 and at least one shoe 114 and kinematic pin slots (not shown) which cooperate with the pins on the load port 24. As with the previously described embodiments, the shoe 114 is provided by a wheel 116 rotatably mounted to the base 104. The groove 112 and shoe 114 are similar to the groove 56 and shoe 68 of the previous embodiments and are not described in detail, reference being made to the previous description.

One advantage of the transport carrier 100 of the embodiment shown in FIGS. 14 and 15 is that it does not require a specific pod design. Instead, the transport carrier 100 may be used with transport pods or other types of containers which are currently being used to house semiconductor wafers.

When the conveyor system 10 of this invention is used to transport semiconductors, the components of the system 10, including the drive system 38 and shoe 68, are constructed of materials which are suitable for use in a clean room environment. In other words, operation of the components over extended periods of time will not generate significant levels of particulate contamination. These constraints will not be present for other applications of the conveyor 10 of this invention which do not require a clean room environment. For non-clean room environments, materials which do not meet clean room standards may be employed for all components of the conveyor system 10.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the Claims appended hereto and their equivalents.

What is claimed is:

1. A conveyor for transporting articles enclosed within a transport container, having an underside with a groove and a shoe spaced apart from the groove, between workstations, the conveyor comprising:

a drive rail for supporting the transport container by a drive system that frictionally engages the groove to solely control the movement of the transport container along the conveyor and constrain the lateral movement of the transport container;

a support rail for supporting the transport container by an upper surface that is located parallel to and spaced apart from said drive rail, said upper surface contacts the shoe and supports the transport container such that the articles are maintained in a substantially horizontal orientation while the transport container moves along the conveyor.

2. The conveyor as recited in claim 1, wherein said drive system includes a plurality of spaced apart wheels that are rotatably mounted to a drive rail housing.

3. The conveyor as recited in claim 2, wherein said groove is tapered outwardly to minimize the contact between said groove and said wheels.

4. The conveyor as recited in claim 1, wherein said support rail includes a plurality of spaced apart wheels that are rotatably mounted to a support rail housing.

5. The conveyor as recited in claim 4, wherein said shoe is movably supported by said plurality of wheels.

6. A conveyor for transporting articles enclosed within a transport container, having an underside with a groove and a shoe spaced apart from the groove, between workstations, the conveyor comprising:

a drive rail for supporting the transport container by a drive system that frictionally engages the shoe to solely control the movement of the transport container along the conveyor;

a support rail located parallel to and spaced apart from said drive rail that supports the transport container by engaging the groove, said support rail constrains the lateral movement of the transport container and supports the transport container such that the articles are maintained in a substantially horizontal orientation while the transport container moves along the conveyor.

7. The conveyor as recited in claim 6, wherein said drive rail includes a plurality of spaced apart wheels that are rotatably mounted to a drive rail housing.

8. The conveyor as recited in claim 6, wherein said support rail includes a plurality of spaced apart wheels that are rotatably mounted to a support rail housing.

9. The conveyor as recited in claim 8, wherein said groove is tapered outwardly to minimize the contact between said groove and said wheels.

* * * * *